(12) United States Patent  
Varnica et al.

(10) Patent No.: US 9,203,432 B2  
(45) Date of Patent: Dec. 1, 2015

(54) SYMBOL FLIPPING DECODERS OF NON-BINARY LOW-DENSITY PARITY CHECK (LDPC) CODES

(71) Applicant: Marvell World Trade Ltd., St. Michael (BB)

(72) Inventors: Nedeljko Varnica, San Jose, CA (US); Shashi Kiran Chilappagari, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 148 days.

(21) Appl. No.: 13/974,901

(22) Filed: Aug. 23, 2013

(65) Prior Publication Data

US 2014/0068393 A1 Mar. 6, 2014

Related U.S. Application Data

(60) Provisional application No. 61/694,163, filed on Aug. 28, 2012.

(51) Int. Cl.
| | | |
|---|---|---|
| H03M 13/11 | (2006.01) | |
| H03M 13/25 | (2006.01) | |
| H03M 13/37 | (2006.01) | |
| H03M 13/45 | (2006.01) | |
| H03M 13/00 | (2006.01) | |

(52) U.S. Cl.
CPC ...... *H03M 13/1108* (2013.01); *H03M 13/1111* (2013.01); *H03M 13/1131* (2013.01); *H03M 13/255* (2013.01); *H03M 13/3723* (2013.01); *H03M 13/451* (2013.01); *H03M 13/458* (2013.01); *H03M 13/6331* (2013.01)

(58) Field of Classification Search
CPC .................. H03M 13/1105; H03M 13/1108
See application file for complete search history.

(56) References Cited

U.S. PATENT DOCUMENTS

| | | | | |
|---|---|---|---|---|
| 5,696,769 | A * | 12/1997 | Choi et al. ................... | 714/746 |
| 8,432,987 | B2 * | 4/2013 | Siti et al. ...................... | 375/267 |
| 8,903,025 | B1 * | 12/2014 | Chandrasekar et al. ...... | 375/340 |
| 8,930,799 | B1 * | 1/2015 | Langner et al. .............. | 714/785 |
| 2003/0074626 | A1 * | 4/2003 | Coker et al. ................. | 714/752 |
| 2005/0193320 | A1 * | 9/2005 | Varnica et al. ............... | 714/800 |
| 2009/0313525 | A1 * | 12/2009 | Savin et al. .................. | 714/752 |
| 2009/0319860 | A1 * | 12/2009 | Sharon et al. ................ | 714/752 |
| 2010/0042904 | A1 * | 2/2010 | Gunnam ....................... | 714/780 |
| 2011/0188615 | A1 * | 8/2011 | Yang et al. ................... | 375/341 |
| 2012/0327982 | A1 * | 12/2012 | Lee et al. ..................... | 375/219 |

FOREIGN PATENT DOCUMENTS

JP 2008-16901 * 1/2008

\* cited by examiner

*Primary Examiner* — Steve Nguyen  
(74) *Attorney, Agent, or Firm* — Ropes & Gray LLP

(57) ABSTRACT

Systems and methods are provided for decoding data. A decoder retrieves data related to a symbol and identifies a plurality of candidate values for the symbol. The decoder determines a distance between each of the plurality of candidate values and a reference value associated with the symbol to obtain a plurality of distances, and the decoder determines whether to update a value of the symbol based at least in part on the plurality of distances.

20 Claims, 7 Drawing Sheets

SYMBOL FLIPPING DECODERS OF NON-BINARY LOW-DENSITY PARITY CHECK (LDPC) CODES

CROSS REFERENCE TO RELATED APPLICATION

This application claims the benefit under 35 U.S.C. §119 (e) of U.S. Provisional Application No. 61/694,163, filed Aug. 28, 2012, which is hereby incorporated by reference herein in its entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

The present disclosure relates generally to data decoding, and more particularly to decoders for data encoded with a low density parity check (LDPC) encoder.

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors in information transmitted in a noisy communications or data storage channel. The information may be encoded (by a LDPC encoder) prior to transmission and then subsequently decoded (by a LDPC decoder) when received. Conventional hard decoding LDPC techniques are typically two-state systems, in which bits in an incoming code are assigned to one of two binary states. Improved decoding results can be achieved using soft information, such as probability distributions. However, storing and processing soft information can be very demanding on processor and memory resources.

Previous LDPC techniques typically determine whether to flip a bit based on whether a given number of checks are unsatisfied. For example, values of one or more bits may be selected to be flipped based on which combination of bits is most likely to reduce the number of unsatisfied check nodes.

SUMMARY

In accordance with an implementation of the disclosure, systems and methods are provided for decoding data. A decoder retrieves data related to a symbol and identifies a plurality of candidate values for the symbol. The decoder determines a distance between each of the plurality of candidate values and a reference value associated with the symbol to obtain a plurality of distances and determines whether to update a value of the symbol based at least in part on the plurality of distances.

The plurality of distances form a distance distribution, wherein the distance distribution includes a number of check nodes associated with at least one distance in the plurality of distances. The determining whether to update a value of the symbol is further based at least in part on a comparison between a threshold and a number of check nodes associated with a first distance in the plurality of distances. The threshold may be modified at a further iteration of the decoding.

In some implementations, determining whether to update the value of the symbol comprises identifying a plurality of thresholds, wherein each threshold in the plurality of thresholds corresponds to a distance in the plurality of distances, and wherein the threshold is modified as the corresponding distance is modified. The determining whether to update the value of the symbol further comprises comparing each threshold in the plurality of thresholds to the corresponding distance in the plurality of distances. The value of the symbol is updated when a number of check nodes associated with a distance in the plurality of distances exceeds a threshold.

A first number of satisfied check nodes associated with the symbol correspond to a first distance in the plurality of distances, and a second number of unsatisfied check nodes associated with the symbol correspond to a second distance in the plurality of distances. In some implementations, each check node in the second number of unsatisfied check nodes is changed to a satisfied check node if the symbol is updated to a second value based on the reference value and the second distance.

In some implementations, the reference value is an original value of the symbol or a current value of the symbol. The symbol is a non-binary symbol, such that there are at least three candidate values in the plurality of candidate values for the symbol.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

This disclosure generally relates to performing decoding at a decoder. To provide an overall understanding of the disclosure, certain illustrative embodiments will now be described, including a decoder that decodes a codeword by updating symbol values in multiple iterations. However, it will be understood by one of ordinary skill in the art that the systems and methods described herein may be adapted and modified as is appropriate for the application being addressed, and that the systems and methods described herein may be employed in other suitable applications, and that such other additions and modifications will not depart from the scope thereof.

Figure 1:
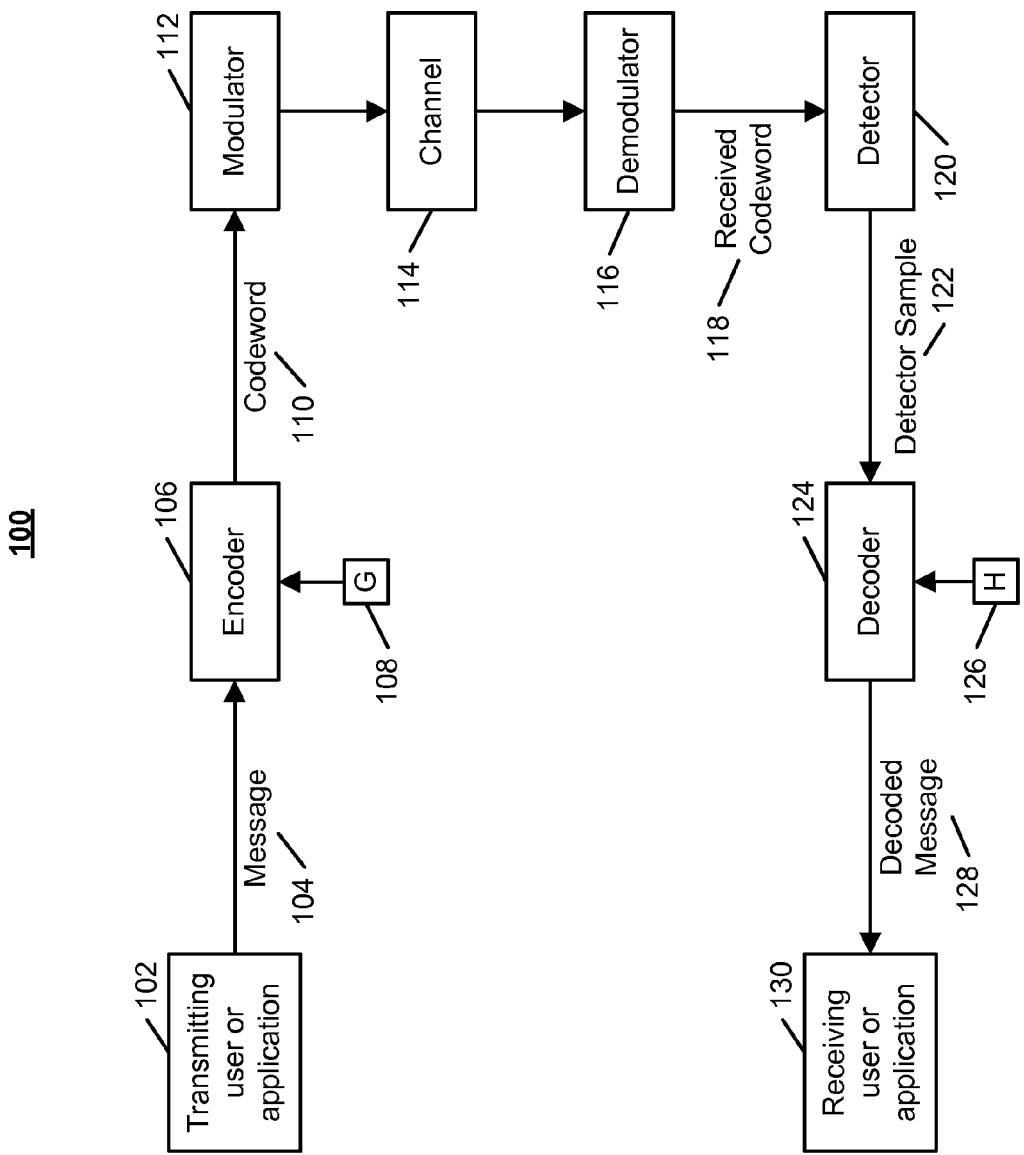
FIG. 1 is a block diagram of an illustrative communications system employing LDPC decoding, in accordance with an embodiment of the present disclosure.

FIG. 1 shows an illustrative communications system 100 for LDPC decoding based, in part, on symbol flipping, in accordance with some embodiments of the present disclosure. A communications system 100 is used to transmit information from a transmitting user or application 102 to a receiving user or application 130. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1). The information produced by the transmitting user or application 102 may correspond to voice information, video information, financial information, or any other type of information that may be represented in digital or analog form, and the data stream produced by transmitting user or application 102 may be a digital data stream.

The transmitting user or application 102 may segment or otherwise divide the data stream into blocks of a fixed length of k symbols. In particular, a message 104, also referred to as m, represents one of these blocks. In particular, the message 104 is k symbols in length, where each symbol may be binary data or non-binary data such as ternary data, quaternary data, any other suitable type of data, or any suitable combination thereof. An encoder 106 is used to encode the message 104 to produce a codeword 110. In one embodiment of the present disclosure, the encoder 106 is an LDPC encoder. However, based on the disclosure and teachings provided herein, it should be clear that the encoder 106 may be any other suitable encoder. The codeword 110, also referred to as c, has a length of n symbols, where n>k. The encoder 106 uses a generator matrix G 108, also referred to as G for notational convenience, to produce the codeword 110. For example, the encoder 106 may perform one or more matrix operations to convert the message 104 into the codeword 110. In an embodiment, the encoder 106 produces the codeword 110 from the message 104 using the generator matrix G 108 by the following matrix multiplication $\underline{c} = G\underline{m}$.

The codeword 110 may be modulated or otherwise transformed by a modulator 112 into a waveform suitable for transmission and/or storage on a channel 114. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 114 refers to the physical medium through which the transmitted waveform passes, or is stored on, before being recovered at a demodulator 116. For example, the channel 114 may be a storage channel that represents a storage medium in a computer system environment or a communications channel that represents the wireless propagation environment in a wireless communications environment. Various characteristics of the channel 114 may corrupt data that is communicated or stored thereon. For example, the channel 114 may be a non-ideal memoryless channel or a channel with memory. The output of the channel 114 is demodulated and processed by the demodulator 116 to produce a received codeword 118. The demodulator 116 may use frequency filters, multiplication and integration by periodic functions, and/or any other suitable demodulation technique to demodulate and/or process the output of the channel 114.

In some embodiments, channel 114 is a binary symmetric channel model. In a binary symmetric channel, assuming that the bits are independent, a smaller number of errors per symbol are more likely to occur than a larger number of errors per symbol. For example, if the sent symbol is three-bits long, and if an error is to occur, it is more likely that a single bit of the three-bit symbol will be in error (and the other two bits of the three-bit symbol are received correctly) than for two bits of the three-bit symbol to be in error. The least likely error to occur is when all three bits of the received three-bit symbol are in error. In an example, if the sent symbol is 000, the most likely received symbols in error are 001, 010 or 100 because in each of these received symbols, only one bit is in error. It is less likely for the received symbols to be 110, 011 or 101, because each of these received symbols requires two bits to be in error. It is least likely for the received symbol to be 111, because this received symbol requires all three bits to be in error. A difference between the originally sent symbol and the received symbol may be referred to as a distance. For example, the distance may correspond to the number of bits of the symbol that are received in error.

In some embodiments, channel 114 is a Q-ary symmetric channel. In a Q-ary symmetric channel, all the incorrect received symbols are equally likely to occur. In an example, the probabilities of a three-bit symbol that is sent as "000" being received as 001, 010, 100, 110, 011, 101, or 111 are the same. In other words, received symbols with different numbers of bits in error are all equally likely to occur, as long as the number of errors is greater than 0. This means that the received symbols with different binary distances between the originally transmitted symbol and the received symbol are all equally likely, as long as that distance is greater than 0.

In some embodiments, channel 114 is a quadrature-pulse amplitude modulation (Q-PAM) channel. In a Q-PAM channel, the probability of an error occurring over the channel is dependent on a proximity between the transmitted symbol and the received symbol. In particular, symbols that neighbor the original symbol (i.e., the transmitted symbol) are more likely to be received than symbols that are further from the original symbol. In an example, the possible symbol values are the integers from 0 to 7, and the symbol 3 is transmitted. In this case, the received symbol is most likely to be 3, after which the more likely symbols are 2 or 4 rather than any of the other symbols (i.e., 0, 1, 5, 6, or 7).

The received codeword 118 contains information related to the codeword 110 and may be a corrupted or otherwise altered version of the codeword 110 originally output by the encoder 106. For example, the received codeword 118 may contain a preliminary estimate or noisy version of the codeword 110, a probability distribution vector of possible values of the codeword produced by the encoder 106, or combinations of these as well as other values.

A detector 120 is used to process the received codeword 118 to produce a detector sample 122, which is an estimate of the original data message 104. The detector 120 samples each symbol in the received codeword 118 and assigns each symbol to a bin based on its value. In some embodiments, the bin is assigned based on a probability distribution. Each symbol sampled by the detector 120 is assigned to one of two or more possible bins, or states.

A decoder 124 receives and iteratively processes the detector sample 122. The detector 120 and the decoder 124 may be two separate processors, or a single processor may be used as both the detector 120 and decoder 124. In general, the decoder 124 comprises control circuitry and/or decoding circuitry used to iteratively correct and/or detect errors present in the detector sample 122, for example, due to transmission through the channel 114. In some embodiments, the decoder 124 uses the parity check matrix H 126 and a decoding technique to produce a decoded message 128. In general, LDPC decoding can be described using a mathematical vector model $Hc=\vec{0}$, in which c is a binary string of length n and H is the parity check matrix H 126, which is a low-density, sparse n×m matrix, wherein, as above, n is the number of symbols in the codeword, m is the number of check nodes satisfying m≥n−k, and k is the number of symbols in the message. The model is satisfied only when the binary string c is the codeword $\underline{c}$ 110. The parity check matrix H 126 is not necessarily unique, and may be chosen to be computationally convenient and/or to decrease the number of errors generated by the decoding technique of the decoder 124.

The iterative decoding technique used by the decoder 124 involves processing a detector sample 122 by updating symbols in the detector sample 122 based on whether checks of the symbol are satisfied or unsatisfied and based on whether the symbol has been previously updated, flipped, or toggled. Generally, as used herein, "flipping" or "toggling" a symbol means to update a value of the symbol to a different value than the current value. Exemplary processing rules for flipping data bits are discussed in U.S. patent application Ser. No. 13/673,371, entitled "METHODOLOGY FOR IMPROVED BIT-FLIPPING DECODER IN 1-READ AND 2-READ SCENARIOS" which is hereby incorporated by reference herein in its entirety.

After processing, each bit of the symbol in the decoded message 128 should be assigned as one of two binary states. When input into the model $Hc=\vec{0}$ as c, the decoded message 128 satisfies the model. Suitable processes for performing the decoding are described in relation to FIGS. 3-6.

The decoded message 128 is delivered to the receiving user or application 130 after being processed by the decoder 124. The receiving user or application 130 may correspond to the same device or entity as the transmitting user or application 102, or the receiving user or application 130 may correspond to a different device or entity. Further, the receiving user or application 130 may be either co-located or physically separated from the transmitting user or application 102. If the decoder 124 corrects all errors that are induced by the channel 114 and other communications effects in the communications system 100, then the decoded message 128 is a logical replica of the message 104. Otherwise, the decoded message 128 may differ from the message 104, and the decoder 124 may declare an error accordingly.

Figure 2A:
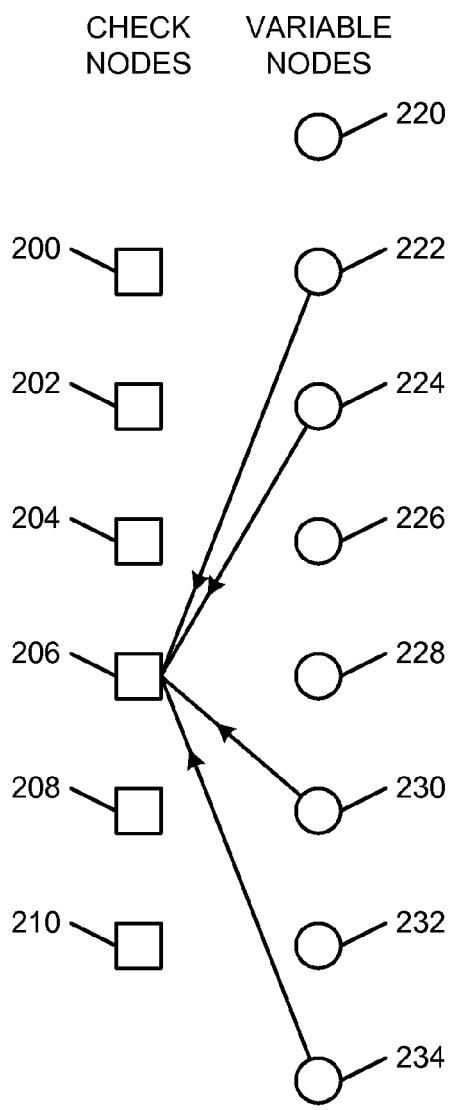
FIGS. 2A and 2B are graphical illustrations of communications between variable nodes representing symbols of a received codeword and check nodes for decoding the received codeword, in accordance with an embodiment of the present disclosure.
Figure 2B:
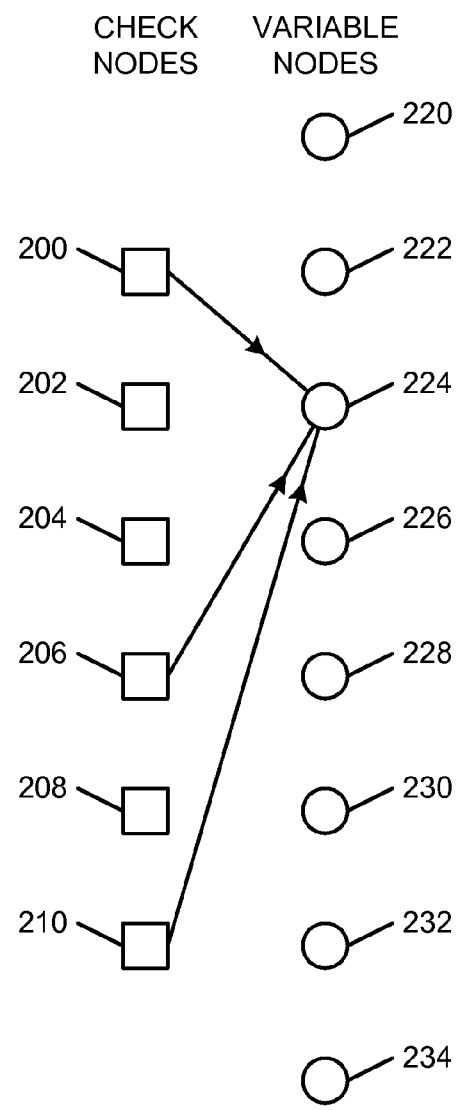

FIGS. 2A and 2B are graphical illustrations of communications between variable nodes 220-234 representing an example codeword and check nodes 200-210 for decoding the codeword, in accordance with an embodiment of the present disclosure.

After the variable nodes 220-234 are assigned input states or values using the detector 120 as described above, a check of the variable nodes is performed by the decoder 124 on a plurality of groups of variable nodes. The decoder 124 uses processing rules to determine a condition of a group of variable nodes. An indication of the determined condition is stored in syndrome memory at a check node, such as check nodes 200-210. The parity check matrix H 126 (FIG. 1) identifies which check nodes store indications of the determined conditions for which variable nodes. For example, for the nodes pictured in FIGS. 2A and 2B, the parity check matrix H 126 may be as follows:

$$H = \begin{bmatrix} 2 & 1 & 1 & 0 & 3 & 0 & 0 & 2 \\ 0 & 0 & 0 & 1 & 0 & 2 & 1 & 0 \\ 1 & 0 & 0 & 2 & 1 & 0 & 0 & 0 \\ 0 & 2 & 3 & 0 & 0 & 2 & 0 & 1 \\ 0 & 0 & 0 & 3 & 2 & 0 & 0 & 2 \\ 3 & 0 & 1 & 0 & 0 & 1 & 2 & 0 \end{bmatrix}$$

Each row corresponds to one of the check nodes, and each column corresponds to one of the variable nodes. In a binary code, the elements of the parity check matrix are 0 or 1, but for a non-binary LDPC code, the elements of the parity check matrix are non-binary. Each row of the parity check matrix forms the coefficients of a parity check equation, which is computed in the non-binary domain.

The decoder 124 references the parity check matrix H 126 to identify which variable nodes should be checked by a particular check node. For example, for the check node 206, the decoder 124 determines that check node 206 stores the result of a check of variable nodes 222, 224, 230, and 234 (i.e., the second, third, sixth, and eighth variable nodes). Then, the decoder 124 retrieves the values stored in these variable nodes. The values in the fourth row of the above parity check matrix H are the coefficients of a parity check equation, which are each multiplied by the corresponding values of the variable nodes. For illustration, the arrows in FIG. 2A indicate that the retrieved values flow from the variable nodes 222, 224, 230, and 234 to the check node 206, and the check node 206 may be considered to "check" the variable nodes 222, 224, 230, and 234. In reality, the variable node values are retrieved by the decoder 124, which processes the values on behalf of the check node 206 according to the processing rules.

From the values received from the variable nodes 222, 224, 230, and 234, the decoder 124 determines whether a given condition for the check node 206 is satisfied or is unsatisfied. An indication of whether the check node 206 is satisfied or unsatisfied (i.e., the "syndrome value" of the check node) is stored in syndrome memory, which stores syndrome values or indications of the check nodes.

After the indications or syndrome values for the check nodes 200-210 have been stored in the syndrome memory, the values of the variable nodes 220-234 may be updated based on the values of the check nodes. The parity check matrix H 126 is again used by the decoder 124 to determine which check nodes should be accessed for a particular variable node. As illustrated in FIG. 2B, for updating the variable node 224, the parity check matrix H 126 given above indicates that check nodes 200, 206, and 210 (i.e., the first, fourth, and sixth variable nodes) should be referenced. Based on the indications of the referenced check nodes, the state of the variable node 224 may be updated. In some embodiments of the present disclosure, the state of the variable node 224 may also be determined based, in part, on whether the variable node 224 had previously been updated, toggled, or flipped, as described in relation with respect to FIGS. 3-6.

Figure 3:
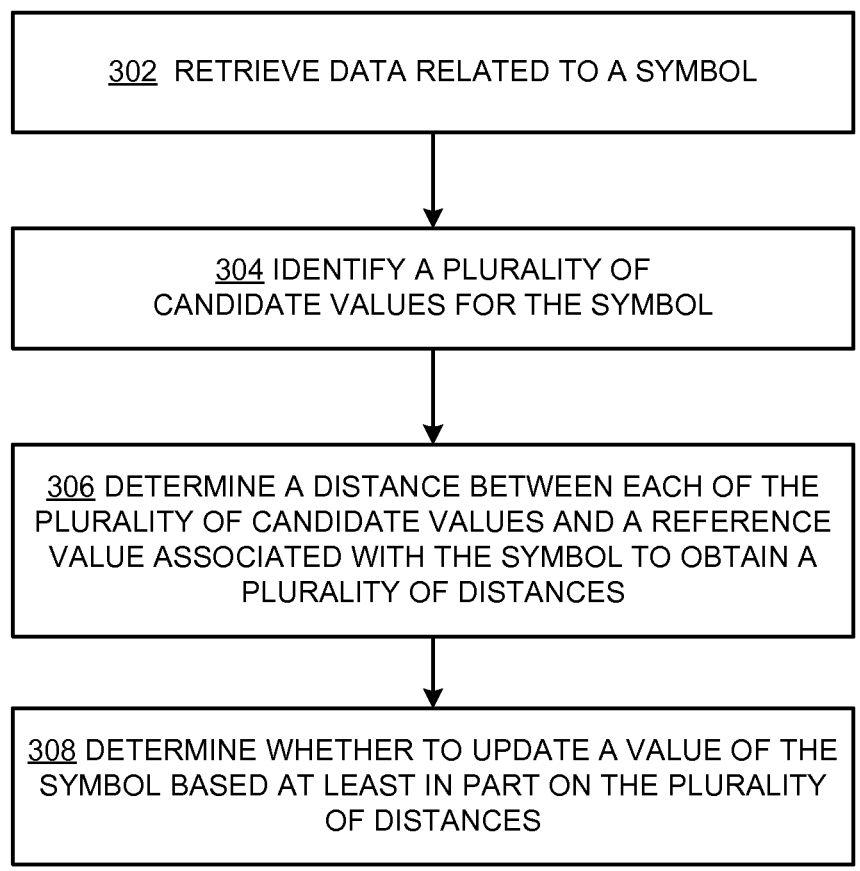
FIG. 3 is a flow chart of a process for decoding data, in accordance with an embodiment of the present disclosure.

FIG. 3 is a high level flow chart of a process 300 for decoding data, in accordance with an embodiment of the present disclosure. The decoder 124 may execute process 300 by retrieving data related to a symbol (302) and identifying a plurality of candidate values for the symbol (304). Process 300 further includes determining a distance between each of the plurality of candidate values and a reference value associated with the symbol to obtain a plurality of distances (306) and determining whether to update a value of the symbol based, at least in part, on the plurality of distances (308).

At 302, the decoder 124 retrieves data related to a symbol. The data retrieved at 302 may correspond to a value of the symbol itself, previous values of this symbol used in previous iterations of the decoding method, other state variables related to the symbol, or any suitable combination thereof. The data retrieved at 302 may also include data related to a plurality of check nodes that are connected to the symbol. The data may further include an indication of whether the check nodes are satisfied or unsatisfied, as described in relation to FIG. 1. For example, the data retrieved at 302 may include a parity check matrix 126 and for a given variable node (as shown in FIGS. 2A and 2B), the decoder 124 may use the parity check matrix H 126 to determine which check nodes are associated with the given symbol. From the parity check matrix H and the value of the symbol, the decoder 124 retrieves a value associated with each check node and can identify the number of check nodes that are satisfied and the number of check nodes that are unsatisfied. The syndrome value associated with each check node may be used to determine whether a check node is satisfied or unsatisfied. For example, the syndrome value may correspond to a sum of products (of a row of the parity check matrix H and symbol values of a set of variable nodes). If the syndrome value is equal to zero, the check node is satisfied. Otherwise, if the syndrome value is not zero, the check node is unsatisfied.

At 304, the decoder 124 identifies a plurality of candidate values for the symbol. The candidate values correspond to values to which the decoder 124 can update the symbol in the current iteration, and may correspond to all possible combinations of values that the set of variable nodes in the codeword may have. In some embodiments, the set of candidate values includes only a subset of the possible combinations of values.

At 306, the decoder 124 determines a distance between each of the plurality of candidate values and a reference value associated with the symbol to obtain a plurality of distances. A distance between a candidate value and a reference value is a measure of proximity between the two values.

Depending on the rules of the decoding, the reference value may have different values. In particular, in some embodiments of the present disclosure, the reference value is fixed to the original value of the symbol, which corresponds to a received portion of a code word 118 that is detected by the detector 120. In other embodiments, the reference value corresponds to a current value of the symbol, which corresponds to the value of the symbol after various iterations of the decoding algorithm have been performed. In other embodiments, the reference value is an intermediate value of the symbol, which corresponds to the value of the symbol after one or more iterations of the decoding algorithm have been performed, but is not necessarily the current value of the symbol. In general, the reference value may be the original value, the intermediate value, the current value, or any other suitable value of the symbol.

Regardless of how the reference value of the symbol is defined, the distance corresponds to a distance between a candidate value and the reference value. In an example, the reference value and the candidate value are each represented by four bits. In this case, the distance corresponds to the number of bits (out of the four total bits) that are different between the reference value and the candidate value. This is generally referred to as the Hamming distance, which may be used when the channel 114 is a binary channel. In another example, the channel 114 may be a Q-ary symmetric channel, in which the distance between one symbol (000, for example) and all other possible symbols is the same. In another example, the channel 114 may be a Q-PAM channel, in which the distance between one symbol value and another symbol value is defined as the difference between the values. In general, a distance as determined at 306 can be any measure of proximity between two values for a symbol.

A distance distribution may be formed based on the plurality of distances formed at 306. The distance distribution is described in more detail in relation to FIGS. 4 and 5, but in general, the distance distribution corresponds to a number of check nodes that would be satisfied if the symbol value is updated to a candidate value that has a particular distance from the reference value.

At 308, the decoder 124 determines whether to update a value of the symbol based, at least in part, on the plurality of distances. As is described in relation to FIGS. 4 and 5, the decoder 124 may use the distance distribution to determine whether to update the value of the symbol. As an example, the decoder 124 may compare the distance distribution with a set of threshold values, and a candidate value may be selected based on the comparison. For example, if a number of check nodes that would be satisfied exceeds a corresponding threshold value, the decoder 124 may update the symbol value to the corresponding candidate value. The set of threshold values may be different for different candidate values (i.e., different distances in the distribution), and the comparison may be based on the number of check nodes, a percentage of the check nodes, the total number of check nodes, or a suitable combination thereof. The high level method 300 is described in more detail in relation to FIGS. 4-6.

Figure 4:
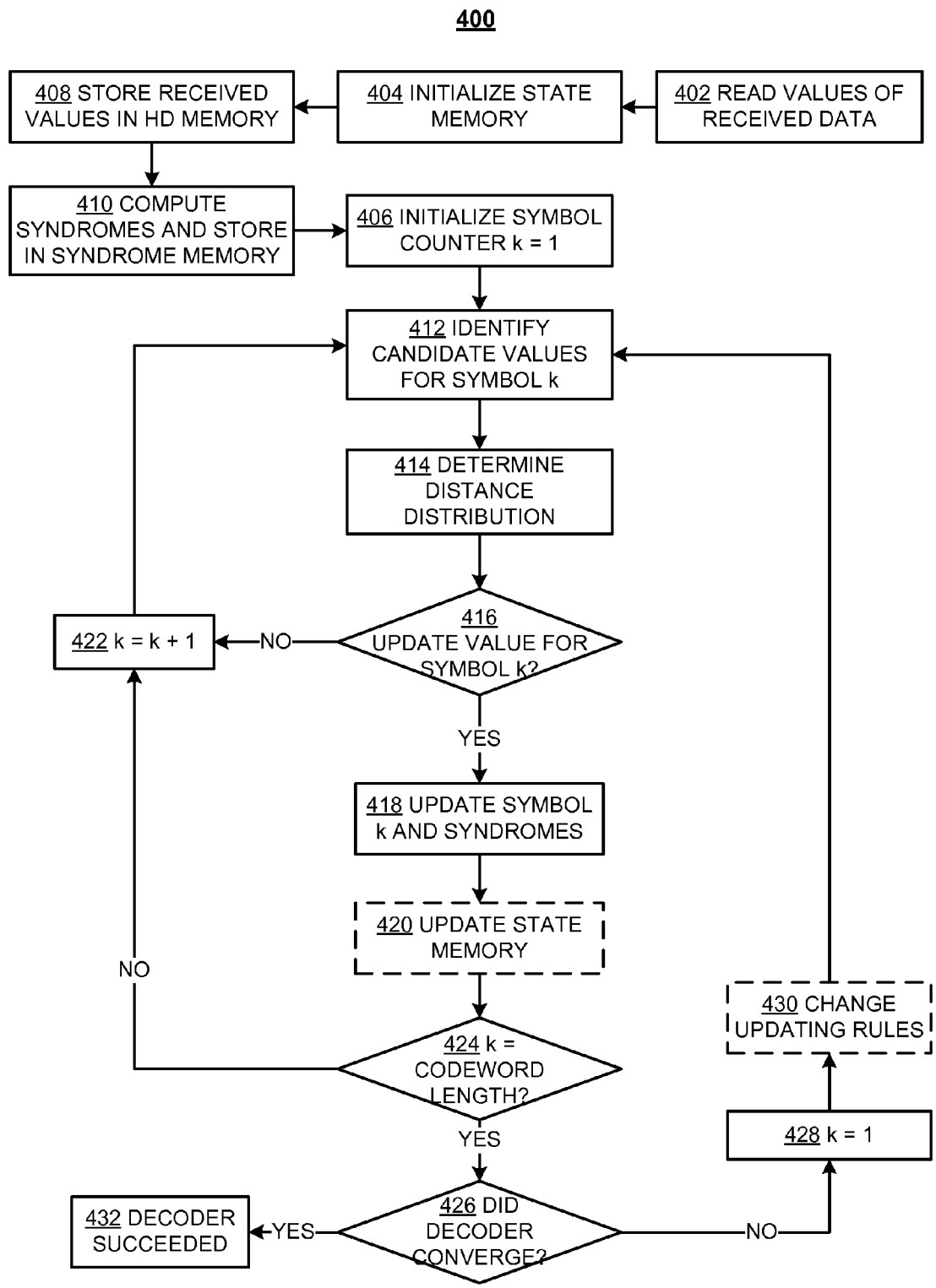
FIG. 4 is a flow chart of a process for performing iterations of a decoding algorithm, in accordance with an embodiment of the present disclosure.

FIG. 4 is a flow chart of a process 400 for performing iterations of a decoding algorithm, in accordance with an embodiment of the present disclosure. The decoder 124 may execute process 400 by reading values of received data (402), initializing state memory (404), storing received values in a hard decision memory (408), computing syndromes and storing them in a syndrome memory (410), and initializing a symbol counter variable k to one (406). Process 400 further includes identifying a set of candidate values for a symbol k (412), determining a distance distribution (414), and determining whether to update a current value for the symbol k (416). If so, the symbol k is updated (418), the state memory is optionally updated (420), and the decoder 124 determines whether k is equal to the length of the current codeword. If not, then the value of k is incremented (422), and process 400 returns to 412 to identify candidate values for the new symbol k. When all symbols in the codeword have been considered, the decoder 124 determines whether the decoding has converged (426). If convergence is reached, the decoder 124 succeeded in decoding the data (432). Otherwise, the symbol counter variable k is re-initialized to one (428), the updating rules are optionally changed (430), and process 400 returns to 412 to identify the candidate values for symbol k.

At 402, the detector 120 reads the values of the received codeword 118 to generate a detector sample 122. At 404, the decoder initializes a state memory, which stores data that indicates or that can be used to determine whether variable nodes have been previously updated. At 408, the decoder initializes a hard decision (HD) memory by storing the original values or signals of the detector sample 122 in variable nodes in the HD memory. At 410, the decoder 124 computes syndromes based on the data stored in the HD memory as described in relation to FIG. 2A, and the decoder 124 stores the computed syndromes in check nodes in a syndrome memory. At 406, the decoder 124 initializes the variable node or symbol counter k=1; in the decoding process, the decoder 124 iterates through each of the variable nodes in the detector sample 122, where each variable node corresponds to a symbol of the codeword being decoded. The decoder reads the syndromes stored in the check nodes for symbol k of the code word as described in relation to FIG. 2B. The decoder 124 may process the syndromes to identify a number of satisfied checks, a number of unsatisfied checks, or both, as described in relation to FIG. 3.

At 412, the decoder 124 identifies candidate values for symbol k. The set of candidate values corresponds to a set of values to which the decoder 124 may update the value of the symbol k in the current iteration. The set of candidate values may be referred to as a constellation. In particular, the decoder 124 reads the syndromes stored in the check nodes for symbol k of the codeword, as described in relation to FIG. 2B. The decoder 124 may process the syndromes to identify a number of satisfied checks, a number of unsatisfied checks, or both, as described in relation to 304 of FIG. 3. The candidate values correspond to a set of values to which the decoder 124 may update the value of the symbol k in the current iteration. Whether the decoder 124 determines to update the symbol k is dependent on the set of candidate values and a number of checks associated with each candidate value. In an example, one candidate value is the current value of the symbol. In another example, one candidate value is the original value of the symbol as detected by the detector 120. The other candidate values correspond to other values of the symbol to which the symbol may be updated, and some the candidate values may correspond to previous values of the symbol (considered in previous iterations of the decoding), while some of the candidate values may correspond to new values of the symbol (not previously considered in previous iterations of the decoding).

At 414, the decoder 124 determines a distance distribution associated with the symbol k. The decoder 124 may execute the process 500 shown in FIG. 5 to determine the distance distribution. The distance distribution corresponds to a number (or a percentage) of check nodes that are associated with each candidate value identified at 412, as a function of distance between the reference value of the symbol and the candidate value. For example, each candidate value has a corresponding distance value, which is indicative of a distance between the candidate value and a reference value. The reference value may be the original symbol as received, the current value of the symbol after a number of previous iterations that may have updated the symbol value, or an intermediate value. The number of check nodes in the distance distribution corresponds to a number of check nodes that would be satisfied if the value for the symbol k is updated to the corresponding candidate value.

In an example, if symbol node k is connected to seven check nodes, and if there are four candidate values, the distance distribution may correspond to $N=[N_0 \ N_1 \ N_2 \ N_3]=[2 \ 4 \ 0 \ 1]$, where the distance increases from left to right. The first value $N_0$ in the distance distribution corresponds to a number of check nodes (two out of seven) that are satisfied, indicating a distance of zero, or $d_0=0$. The check nodes that indicate a distance of zero means that the check nodes are satisfied for the reference value of the symbol, because the reference value is the same as the candidate value when the distance is zero. When the reference value is the original value of the symbol, this means that two out of the seven check nodes were originally satisfied with the original value as received, and if the symbol were updated back to its original value, the two check nodes would be satisfied. When the reference value is the current value of the symbol, this means that two out of the seven check nodes are currently satisfied with the current value of the symbol.

In the example distribution [2 4 0 1], five out of the seven check nodes are unsatisfied. In particular, four out of the five unsatisfied check nodes would be satisfied if the symbol is updated to a candidate value with distance $d_1$ from the reference value, zero of the unsatisfied check nodes would be satisfied if the symbol is updated to a candidate value with distance $d_2$ from the reference value, and one of the unsatisfied check nodes would be satisfied if the symbol is updated to a candidate value with distance $d_3$ from the reference value.

In a two-bit binary example, the candidate values are 00, 01, 10, and 11. The distance may be measured in terms of a number of different bits, or the Hamming distance, which may be used in the case of a binary channel as described in relation to FIG. 1. In this case, $d_0=0$, $d_1=1$, $d_2=1$, and $d_3=2$. Thus, it is possible to have two candidate values that have the same distance, but each of the candidate values is still assigned its own value in the distance distribution. In other words, even though $d_1$ is equal to $d_2$ in the example, the check nodes that would be satisfied for $d_1$ do not necessarily correspond to the same check nodes that would be satisfied for $d_2$. Thus, $d_1$ and $d_2$ are kept as separate values in the distance distribution even though the Hamming distance is the same. Forming a distance distribution such as the example shown herein is useful for determining whether to update the symbol k as well as determining which value the decoder 124 should update the symbol k. In some embodiments, the distance distribution is not represented by the numbers of check nodes, but rather a percentage of check nodes that would be satisfied for each candidate value. For example, rather than representing the distance distribution as [2 4 0 1], as in the above example, the distance distribution may be represented by [29% 57% 0% 14%]. A process for determining the distance distribution is described in more detail in relation to FIG. 500.

At 416, the decoder 124 determines whether to update the value for the symbol k. In particular, the decoder 124 considers the distance distribution formed at 414 and compares the values $N_i$ to a set of threshold values. Generally, it is desirable for it to be more difficult, or less likely, to update the symbol k to a value that is very far from the current value or from the originally received value. Thus, the decoder 124 will not update the symbol value to a candidate value that has a large distance from the reference value, unless a large number of the check nodes would be satisfied with the candidate value. For example, the decoder 124 may not update the symbol to the fourth candidate value (corresponding to the fourth and largest distance) for a distance distribution of [2 4 0 1], but a distance distribution of [0 0 0 7] may warrant an update to the fourth candidate value. Furthermore, the decoder 124 is more likely to let the symbol value remain unchanged, or to allow the symbol value to return to the original value, even if the number of currently satisfied check nodes $N_0$ is not large. For example, the decoder 124 may select to allow the symbol value to remain unchanged or return to the original value for a distance distribution of [2 4 0 1], even though $N_0=2$ is not the largest value in the distribution ($N_1=4$ is the largest value).

To determine whether to update the value for the symbol k, the decoder 124 compares the values $N_i$ in the distance distribution to a set of threshold values. If the value $N_i$ exceeds a corresponding threshold value, the symbol may be updated to the corresponding candidate value. To ensure that updating to a candidate value that is far from the reference value is harder than updating to a candidate value that is nearer to the reference value, the thresholds may have different values for different distances. For example, the threshold value may increase as the distance increases, such that the decoder 124 will only update the symbol value to a value that is far from the reference value when a very large number of the check nodes would be satisfied with the far value. The threshold values may be denoted $T_{ij}$, where $T_{ij}$ increases as i (and the distance) increases, or equivalently, $T_{0j} < T_{1j} < T_{2j} < \ldots < T_{Ij}$. In this way, making the update to a candidate value with distance D is more likely than an update to a candidate value with distance that is larger than D. In some embodiments, $T_{ij}$ changes as j (the iteration number) increases. This process is described in more detail in relation to FIG. 500.

If the decoder 124 determines not to update the symbol k in the current iteration, process 400 proceeds to 422 to increment the value of the symbol counter k and returns to 412 to identify candidate values for the next symbol k.

Otherwise, if the decoder 124 determines to update the symbol k in the current iteration, the decoder 124 updates the symbol k at 418. In some embodiments, the decoder 124 selects the most likely candidate value. The most likely candidate value may correspond to the candidate value with the largest value for $N_i$, or the candidate value with the largest number of check nodes that would be satisfied if the symbol was updated to that candidate value. However, this approach of selecting the most likely candidate value may not be desirable for at least two reasons.

First, it may be undesirable to update the symbol to a candidate value unless the check nodes are decisively indicating that such an update should occur. For example, for a two-bit symbol with reference value (original value, current value, or intermediate value, for example) 00, the distance distribution includes four values for $N_i$, where $N_0$ corresponds to 00, $N_1$ corresponds to 01, $N_2$ corresponds to 10, and $N_3$ corresponds to 11. In an example, the distance distribution may include values of $N_i$: [0 2 1 1]. For four unsatisfied check nodes and zero satisfied check nodes, it may be desirable to leave the symbol unchanged, rather than to simply select the second candidate value so that the two check nodes are satisfied. In particular, in the example of [0 2 1 1], the four unsatisfied check nodes are not decisively pointing to a particular candidate value. Instead, the four unsatisfied check nodes are distributed across three candidate values.

Second, updates to the symbol that would require larger distances should be made less frequently than symbol updates that require shorter distances. For example, a distance distribution of [0 2 0 3] may indicate that an update to the fourth candidate value (with the largest distance) would satisfy three currently unsatisfied check nodes. However, it may be undesirable to update the symbol to the fourth candidate value unless the check nodes provide a decisive indication that such an update should be made. An example of a decisive indication is a distance distribution of [0 0 0 5].

In some embodiments of the present disclosure, the value to which the decoder 124 updates the symbol k is a value is selected based on a comparison between the values in the distance distribution and the set of threshold values as described above. In an example, the selected candidate value may be the first value $N_i$ in the distance distribution that exceeds the corresponding threshold. In particular, each value $N_i$ may be compared to a respective threshold in each of a number of iterations, where the number of iterations corresponds to the number of values in the distance distribution. The selected value may be the first value that is considered in the iterations that exceeds the corresponding threshold. In another example, multiple candidate values may have corresponding values $N_i$ in the distance distribution that exceed their corresponding thresholds. In this case, the decoder 124 may select the candidate value with the larger value of $N_i$, or the decoder 124 may select the candidate value with the smaller distance. Rules for how to resolve situations like these (i.e., when multiple values $N_i$ in the distance distribution exceed their corresponding thresholds) may be selected at 430.

In some embodiments, if the reference value is the original symbol value, the decoder 124 may determine to update the value of the symbol to the original value if the number of unsatisfied checks exceeds a threshold and if some criterion on the history of the decoder is met. As an example, if the current symbol value is not the same as the originally received symbol value, the symbol may be updated back to the original value. In particular, it may be desirable to easily allow the symbol to return to original value (by using a small threshold value, for example). For example, with a distance distribution of [2 3 0 0], the decoder 124 may select the candidate value that has distance zero from the reference symbol. In this case, the decoder 124 determines to return the value of the symbol to its original value, even though the selected candidate value is not the most likely symbol. In an example, the original value of the symbol is selected if the number of check nodes that indicate they would be satisfied with the original value is in a certain percentage range (>p%). In other words, when the reference value is the original value, this means identifying when the first entry in the distance distribution is greater than p% of the total number of check nodes connected to the current variable node.

At 418, the decoder 124 also updates the syndrome memory to reflect the value of the updated symbol or variable node. In particular, the syndrome for of each check node that is connected to the variable node for symbol k is recomputed, and the values of those check nodes are updated. In some embodiments, e.g., if the state memory stores an indication of whether a symbol has been updated, the state memory for symbol k is updated at 420.

At 424, the decoder 124 determines whether k equals the codeword length, i.e., that the process of 412 through 422 has been performed on each variable node in the detector sample 122 and the end of the detector sample 122 has been reached. If the end of the detector sample 122 has not been reached, k is incremented at 422, and the process of 412 through 422 is performed on the following variable node (i.e., the following symbol k) in the detector sample.

Once the end of the detector sample 122 has been reached, at 426, this indicates the end of an iteration of the decoding process. At this point, the decoder 124 determines whether the decoding process has converged. In some embodiments, this means that the conditions of all of the check nodes are satisfied. In other embodiments, where outer error correction codes may be present, conditions for convergence are relaxed, and a minimum amount of error (e.g., a minimum amount of erased variable nodes or a minimum amount of unsatisfied check nodes) is permitted. If the decoder 124 has converged, at 432, it is determined that the decoder 124 succeeded. The decoder 124 then outputs the decoded message 128 to the receiving user or application 130. If the decoder 124 did not converge, at 428, k is reset to 1, and in some embodiments, at 430, the updating rules are changed for the following iteration through the detector sample 122. Various updating rules and the changing of the updating rules are described further in relation to FIG. 6.

In some embodiments, if the decoder 124 did not converge, before resetting k at 428 and iterating through the detector sample 122 again, the decoder 124 determines whether an iteration number j is less than a maximum number of iterations $j_{max}$. If the iteration number j is less than the maximum number of iterations $j_{max}$, the process continues to 428 and the variable nodes are processed again. If the iteration number j is equal to the maximum number of iterations $j_{max}$, the method terminates. After terminating, the decoder 124 may output the result of the decoding to the receiving user or application 130. Additionally or alternatively, the decoder 124 or the receiving user or application 130 can request that the transmitting user or application 102 retransmit the codeword 110. The decision of whether to accept the message or request the message be resent may be based on the degree to which the decoder 124 determines that the decoded message 128 is incorrect.

Figure 5:
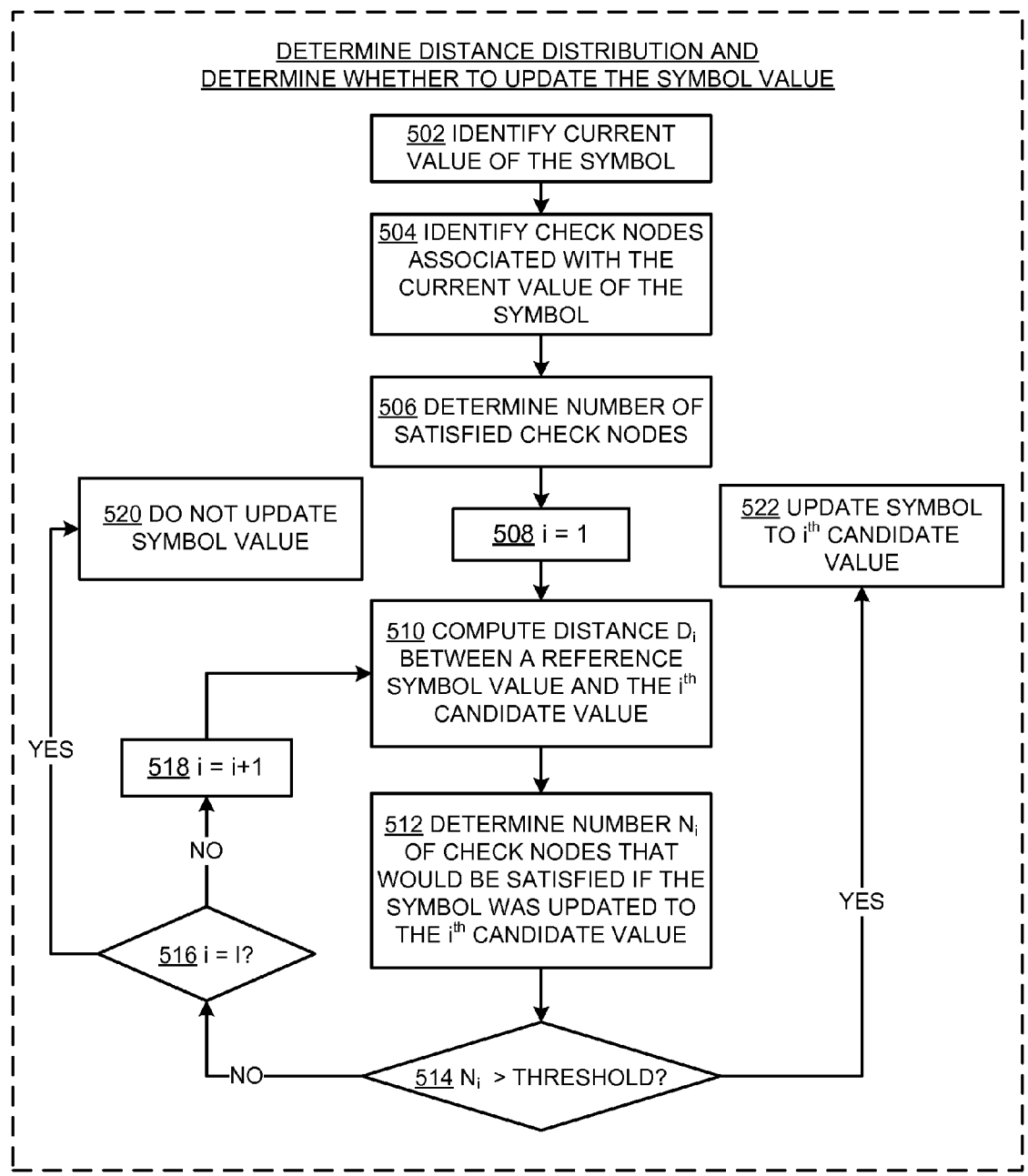
FIG. 5 is a flow chart of a process for determining a distance distribution, in accordance with an embodiment of the present disclosure.

FIG. 5 is a flow chart of a process 500 for determining a distance distribution, in accordance with an embodiment of the present disclosure. The decoder 124 may execute process 500 as a part of the determining the distance distribution (414 of process 400). Process 500 includes identifying a current value of the symbol (502), identifying check nodes associated with the current value of the symbol (504), and determining a number of satisfied check nodes (506). A candidate iteration parameter i is initialized to one (508), a distance $D_i$ is computed between a reference symbol value and the $i^{th}$ candidate value (510), and the decoder 124 determines a number $N_i$ of check nodes that would be satisfied if the symbol was updated to the $i^{th}$ candidate value (512). If the number $N_i$ exceeds a threshold value (514), the symbol is updated to the $i^{th}$ candidate value (522). Otherwise, if the candidate iteration parameter i is not equal to the number of candidate values I (516), the candidate iteration parameter i is incremented (518), and process 500 returns to 510 to compute the distance $D_i$. Otherwise, if all candidate values have been considered, and none of their corresponding numbers of check nodes $N_i$ exceeds a threshold, the symbol value is not updated (520).

At 502, the decoder 124 identifies a current value of the symbol. If the symbol was recently received, the current value of the symbol may correspond to the original value of the symbol as received. Otherwise, the current value of the symbol may correspond to an updated value that was used in a previous iteration of the decoding.

At 504, the decoder 124 identifies check nodes that are associated with the current value of the symbol. The decoder 124 reads the syndromes stored in the check nodes for symbol k of the codeword, as described in relation to FIG. 2B.

At 506, the decoder 124 determines a number of satisfied check nodes. The number of satisfied check nodes is the number of check nodes that are connected to the variable node of the current symbol that are satisfied with the current value. In particular, a satisfied check node is a check node for which the sum of the product between the corresponding row in the parity check matrix and the current symbol values of the connected variable nodes is zero. If the sum of this product is not zero, this means that the check node is unsatisfied. Thus, the number of satisfied check nodes may be determined by multiplying the parity matrix H 126 by a vector with elements corresponding to the current set of symbol values of the variable nodes and identifying the check nodes that have corresponding product elements that are equal to zero.

At 508, a candidate iteration parameter i is initialized to one. The iteration parameter i is a value that indicates which candidate value is currently under consideration. Thus, the iteration parameter i starts at one and may be incremented until each candidate value is considered.

At 510, the decoder 124 computes a distance $D_i$ between a reference symbol value and the $i^{th}$ candidate value. As described above, the reference symbol value may be the original value of the symbol, a current value of the symbol, a previous value of the symbol, or any other suitable value. In some embodiments, the distance $D_i$ corresponds to a Hamming distance between the reference symbol value and the candidate value. Using the Hamming distance for the distance $D_i$ may be useful if the channel 114 is a binary channel, as described in relation to FIG. 1.

In general, the distance $D_i$ is a metric of a relative proximity and/or likelihood between two symbols. In some embodiments, the channel 114 is a Q-ary symmetric channel, as described in relation to FIG. 1. In this case, all the possible updated values (i.e., the candidate values) are equally likely, while the current value of the symbol may be associated with a different likelihood. For example, if the transmitted symbol is three bits long and has value 000, then the seven other possible candidate values (i.e., 001, 010, 011, 100, 101, 110, and 111) are each equally likely. In this case, if the reference value is 000, then $D_0$ is zero because the reference value is the same as the candidate value 000. Furthermore, the other seven distances ($D_1$, $D_2$, $D_3$, $D_4$, $D_5$, $D_6$, and $D_7$) are equal because their corresponding candidate values are all equally likely to occur.

In some embodiments, the channel 114 is a Q-PAM channel as described in relation to FIG. 1. In this case, the neighboring symbols are more likely than symbols that are further away. For example, if the transmitted symbol is 3, and if the candidate values take on integer values between from 0 to 7, the received symbol is more likely to be 2 or 4, compared to the values 0, 1, 5, 6, and 7. Thus, the distance between the reference value and a candidate value may be defined as the distance in the Q-PAM channel constellation.

Described herein are several examples of how to compute a distance between a reference symbol value and a candidate value. However, one of ordinary skill in the art will understand that in general, a distance metric between two values as described herein may be computed in any way.

At 512, the decoder 124 determines a number $N_i$ of check nodes that would be satisfied if the symbol is updated to the $i^{th}$ candidate value. At 514, the decoder 124 compares the number $N_i$ to a threshold value. The threshold may be determined based on the distance between the reference symbol value and the current candidate value under consideration. The threshold may also be determined based on how many iterations have already occurred in the decoding process.

As an example, a set of values $T_{ij}$ may be updated for each iteration j. In particular, $T_{ij}$ may increase as the candidate value i increases (and thus as the distance from the reference value increases). Furthermore, the iterations may be divided into multiple tiers. For example, if $j_{max}$ is a maximal number of iterations that will be performed in the decoding process, the set of $j_{max}$ iterations may be divided into different tiers, such as a first tier for iterations j=1 to $j_{max}/2$ and a second tier for j=$j_{max}/2+1$ to $j_{max}$. In an example, $T_{ij}$ may be smaller or larger for the first tier (i.e., earlier iterations) than in the second tier (i.e., later iterations). A smaller value for $T_{ij}$ implies a looser condition is required because $N_i$ has to exceed $T_{ij}$ in order to update the symbol value to the $i^{th}$ candidate value. In the example given, there are only two tiers of iterations. However, one of ordinary skill in the art will understand that the systems and methods described herein can be used for any number of tiers of iterations, without departing from the scope of the disclosure.

If $N_i$ exceeds the threshold, process 500 proceeds to 522 to update the symbol value to the $i^{th}$ candidate value. Otherwise, process 500 proceeds to 516 to determine whether the iteration parameter i is equal to the total number of candidate values I. If not, the iteration parameter i is incremented at 518 and process 500 returns to 510 to compute the distance for the next candidate value. Otherwise, if all candidate values have been considered (i.e., i=I), and if none of the candidate values have values of $N_i$ that exceed the corresponding threshold, then process 500 proceeds to 520 and does not update the current symbol value.

Figure 6:
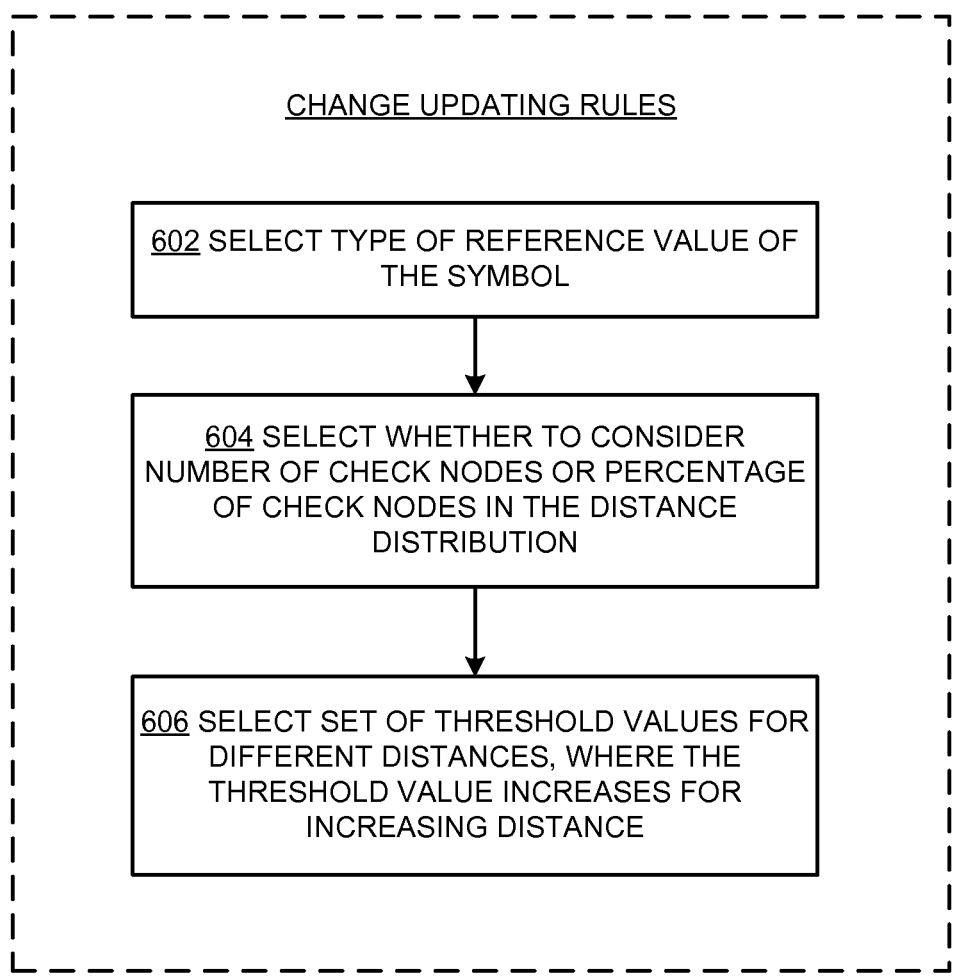
FIG. 6 is a flow chart of a process for changing the updating rules in performing an iteration of a decoding algorithm, in accordance with an embodiment of the present disclosure.

FIG. 6 is a flow chart of a process 600 for changing the updating rules in performing an iteration of a decoding algorithm, in accordance with an embodiment of the present disclosure. The decoder 124 may execute process 600 as a part of the optional changing the updating rules (430 of process 400). Process 600 includes selecting a reference value for the symbol (602), selecting whether to consider a number of check nodes or a percentage of check nodes in the distance distribution (604), and selecting a set of threshold values for the different distances, where the threshold value increases for increasing distance (606).

At 602, a type of reference value for the symbol is selected. The type of reference value may be the original value of the symbol as received, the current value of the symbol (as used or updated in the previous iteration), or an intermediate value. In general, the type of reference value for the symbol may remain fixed across multiple iterations of the decoding, but in some embodiments, the type of reference value may be updated for different iterations.

At 604, the decoder 124 selects whether to consider a number of check nodes, a percentage of check nodes in the distance distribution, or a combination of both. Furthermore, the decoder 124 may also select whether to consider a total number of unsatisfied check nodes. Depending on the selection at 604, the set of threshold values that are selected at 606 may be different.

At 606, the decoder 124 selects a set of threshold values for different distances, where the threshold value increases for increasing distance. For example, as described above, $T_{ij}$ increases for candidate values with increasing distance i. Furthermore, $T_{ij}$ may increase or decrease for increasing tiers of iterations j. Depending on what was selected at 604, the units of $T_{ij}$ may be in number of check nodes, or in percentage of check nodes. If the decoder 124 determines to use both numbers of check nodes and percentages of check nodes, different values for $T_{ij}$ may be used (T_number$_{ij}$ and T_percentage$_{ij}$, for example).

In some embodiments, the values for the thresholds $T_{ij}$ is dependent on the degree of a variable node and the number of unsatisfied check nodes. The degree of a variable node is a total number of check nodes to which the variable node is connected. In an example, a variable node with degree seven may use different thresholds depending on how many of the check nodes are unsatisfied.

In general, process 600 may include updating any other process rules associated with performing an iteration of decoding. For example, the decoder 124 may update the symbol based on a history or a prior state of the decoder 124. For example, a distance may be defined between a current value of the symbol and a previous value of the symbol (in some prior decoder stage or iteration). The distance distribution may be generated on the differently defined distances, and the candidate values may be separated into different categories based on the distances $D_i$. Depending on whether a candidate value falls into a particular category, the symbol value may or may not get updated to that candidate value. The thresholds may be different for different categories.

Figure 7:
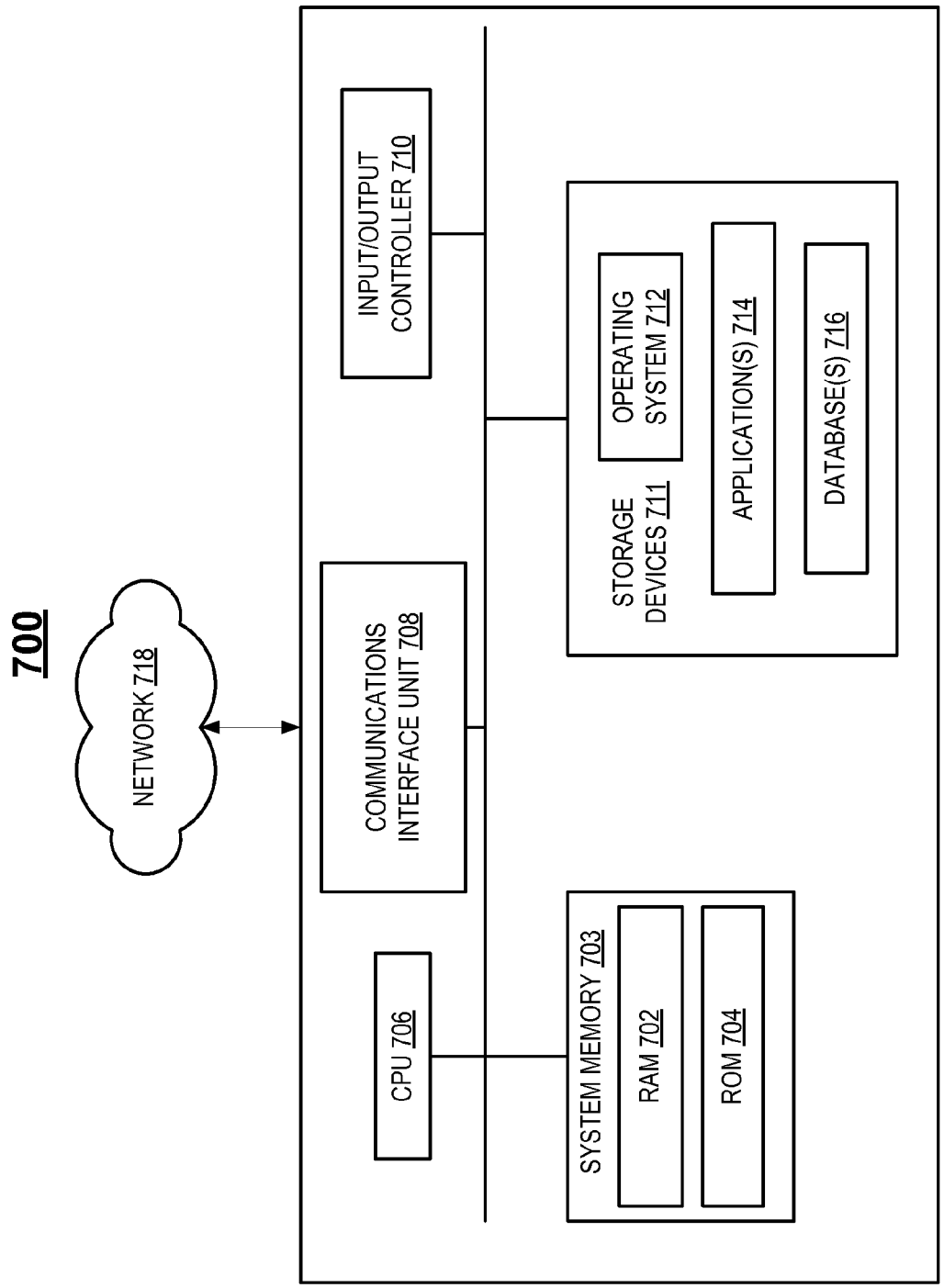
FIG. 7 is a block diagram of a computing device, for performing any of the processes described herein, in accordance with an embodiment of the disclosure.

FIG. 7 is a block diagram 700 of a computing device, such as any of the components of the system of FIG. 1, for performing any of the processes described herein, in accordance with an embodiment of the disclosure. Each of the components of these systems may be implemented on one or more computing devices 700. In certain aspects, a plurality of the components of these systems may be included within one computing device 700. In certain embodiments, a component and a storage device 711 may be implemented across several computing devices 700.

The computing device 700 comprises at least one communications interface unit 708, an input/output controller 710, system memory 703, and one or more data storage devices 711. The system memory 703 includes at least one random access memory (RAM 702) and at least one read-only memory (ROM 704). All of these elements are in communication with a central processing unit (CPU 706) to facilitate the operation of the computing device 700. The computing device 700 may be configured in many different ways. For example, the computing device 700 may be a conventional standalone computer or alternatively, the functions of computing device 700 may be distributed across multiple computer systems and architectures. In FIG. 7, the computing device 700 is linked, via network 718 or local network, to other servers or systems.

The computing device 700 may be configured in a distributed architecture, wherein databases and processors are housed in separate units or locations. Some units perform primary processing functions and contain at a minimum a general controller or a processor and a system memory 703. In distributed architecture embodiments, each of these units may be attached via the communications interface unit 708 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to: Ethernet, SAP, SAS™, ATP, BLUETOOTH™, GSM and TCP/IP.

The CPU 706 comprises a processor, such as one or more conventional microprocessors and one or more supplementary co-processors such as math co-processors for offloading workload from the CPU 706. The CPU 706 is in communication with the communications interface unit 708 and the input/output controller 710, through which the CPU 706 communicates with other devices such as other servers, user terminals, or devices. The communications interface unit 708 and the input/output controller 710 may include multiple communication channels for simultaneous communication with, for example, other processors, servers or client terminals.

The CPU 706 is also in communication with the data storage device 711. The data storage device 711 may comprise an appropriate combination of magnetic, optical or semiconductor memory, and may include, for example, RAM 702, ROM 704, flash drive, an optical disc such as a compact disc or a hard disk or drive. The CPU 706 and the data storage device 711 each may be, for example, located entirely within a single computer or other computing device; or connected to each other by a communication medium, such as a USB port, serial port cable, a coaxial cable, an Ethernet cable, a telephone line, a radio frequency transceiver or other similar wireless or wired medium or combination of the foregoing. For example, the CPU 706 may be connected to the data storage device 711 via the communications interface unit 708. The CPU 706 may be configured to perform one or more particular processing functions.

The data storage device 711 may store, for example, (i) an operating system 712 for the computing device 700; (ii) one or more applications 714 (e.g., computer program code or a computer program product) adapted to direct the CPU 706 in accordance with the systems and methods described here, and particularly in accordance with the processes described in detail with regard to the CPU 706; or (iii) database(s) 716 adapted to store information that may be utilized to store information required by the program.

The operating system 712 and applications 714 may be stored, for example, in a compressed, an uncompiled and an encrypted format, and may include computer program code. The instructions of the program may be read into a main memory of the processor from a computer-readable medium other than the data storage device 711, such as from the ROM 704 or from the RAM 702. While execution of sequences of instructions in the program causes the CPU 706 to perform the process steps described herein, hard-wired circuitry may be used in place of, or in combination with, software instructions for embodiment of the processes of the present disclosure. Thus, the systems and methods described are not limited to any specific combination of hardware and software.

Suitable computer program code may be provided for performing one or more functions in relation to decoding a codeword as described herein. The program also may include program elements such as an operating system 712, a database management system and "device drivers" that allow the processor to interface with computer peripheral devices (e.g., a video display, a keyboard, a computer mouse, etc.) via the input/output controller 710.

The term "computer-readable medium" as used herein refers to any non-transitory medium that provides or participates in providing instructions to the processor of the computing device 700 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer can read.

Various forms of computer readable media may be involved in carrying one or more sequences of one or more instructions to the CPU 706 (or any other processor of a device described herein) for execution. For example, the instructions may initially be borne on a magnetic disk of a remote computer (not shown). The remote computer can load the instructions into its dynamic memory and send the instructions over an Ethernet connection, cable line, or even telephone line using a modem. A communications device local to a computing device 700 (e.g., a server) can receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method for decoding data by a decoder communicatively coupled to a memory, the method comprising:
   retrieving data related to a symbol from the memory;
   identifying a plurality of candidate values for the symbol;
   determining a distance between each of the plurality of candidate values and a reference value associated with the symbol to obtain a plurality of distances; and
   determining whether to update a value of the symbol based at least in part on a comparison between a threshold and a number of check nodes associated with a first distance in the plurality of distances.

2. The method of claim 1, wherein the plurality of distances form a distance distribution, wherein the distance distribution includes the number of check nodes associated with the first distance in the plurality of distances, and wherein determining whether to update the value of the symbol is further based on the number of check nodes associated with the first distance.

3. The method of claim 1, further comprising modifying the threshold at a further iteration of the decoding.

4. The method of claim 1, wherein determining whether to update the value of the symbol comprises:
   identifying a plurality of thresholds, wherein each threshold in the plurality of thresholds corresponds to a corresponding distance in the plurality of distances, and wherein the threshold is modified as the corresponding distance is modified; and
   comparing each threshold in the plurality of thresholds to the corresponding distance in the plurality of distances.

5. The method of claim 1, further comprising updating the value of the symbol when the number of check nodes associated with the first distance in the plurality of distances exceeds the threshold.

6. The method of claim 1, wherein a first number of satisfied check nodes associated with the symbol correspond to the first distance in the plurality of distances.

7. The method of claim 6, wherein each check node in a second number of unsatisfied check nodes is changed to a satisfied check node if the symbol is updated to a second value based on the reference value and a second distance in the plurality of distances.

8. The method of claim 1, wherein the reference value is an original value of the symbol or a current value of the symbol.

9. The method of claim 1, further comprising flipping a current value of the symbol, wherein the flipping comprises updating the current value from a first candidate value in a plurality of candidate values for the symbol to a second candidate value in the plurality of candidate values, and wherein there are at least three candidate values in the plurality of candidate values.

10. The method of claim 1, wherein a first number of unsatisfied check nodes associated with the symbol correspond to the first distance in the plurality of distances.

11. A decoder comprising decoding circuitry communicatively coupled to a memory, wherein the decoding circuitry is configured to:
    retrieve data related to a symbol from the memory;
    identify a plurality of candidate values for the symbol;

determine a distance between each of the plurality of candidate values and a reference value associated with the symbol to obtain a plurality of distances; and determine whether to update a value of the symbol based at least in part on a comparison between a threshold and a number of check nodes associated with a first distance in the plurality of distances.

12. The decoder of claim 11, wherein the plurality of distances form a distance distribution, wherein the distance distribution includes the number of check nodes associated with the first distance in the plurality of distances, and wherein the decoding circuitry is configured to determine whether to update the value of the symbol further based on the number of check nodes associated with the first distance.

13. The decoder of claim 11, wherein the decoding circuitry is further configured to modify the threshold at a further iteration of the decoding.

14. The decoder of claim 11, wherein the decoding circuitry is configured to determine whether to update the value of the symbol by:

identifying a plurality of thresholds, wherein each threshold in the plurality of thresholds corresponds to a corresponding distance in the plurality of distances, and wherein the threshold is modified as the corresponding distance is modified; and comparing each threshold in the plurality of thresholds to the corresponding distance in the plurality of distances.

15. The decoder of claim 11, wherein the decoding circuitry is configured to update the value of the symbol when the number of check nodes associated with the first distance in the plurality of distances exceeds the threshold.

16. The decoder of claim 1, wherein a first number of satisfied check nodes associated with the symbol correspond to the first distance in the plurality of distances.

17. The decoder of claim 16, wherein each check node in a second number of unsatisfied check nodes is changed to a satisfied check node if the symbol is updated to a second value based on the reference value and a second distance in the plurality of distances.

18. The decoder of claim 11, wherein the reference value is an original value of the symbol or a current value of the symbol.

19. The decoder of claim 11, wherein the decoding circuitry is further configured to flip a current value of the symbol by updating the current value from a first candidate value in a plurality of candidate values for the symbol to a second candidate value in the plurality of candidate values, and wherein there are at least three candidate values in the plurality of candidate values.

20. The decoder of claim 11, wherein a first number of unsatisfied check nodes associated with the symbol correspond to the first distance in the plurality of distances.

* * * * *